(12) United States Patent
Tian

(10) Patent No.: US 7,276,183 B2
(45) Date of Patent: Oct. 2, 2007

(54) METAL SILICATE-SILICA-BASED POLYMORPHOUS PHOSPHORS AND LIGHTING DEVICES

(75) Inventor: Yongchi Tian, Princeton Junction, NJ (US)

(73) Assignee: Sarnoff Corporation, Princeton, NJ (US)

( * ) Notice: Subject to any disclaimer, the term of this patent is extended or adjusted under 35 U.S.C. 154(b) by 14 days.

(21) Appl. No.: 11/149,648

(22) Filed: Jun. 10, 2005

(65) Prior Publication Data

US 2006/0214175 A1    Sep. 28, 2006

Related U.S. Application Data

(60) Provisional application No. 60/684,373, filed on May 24, 2005.

(51) Int. Cl.
    C09K 11/59    (2006.01)
    H01J 1/62     (2006.01)

(52) U.S. Cl. .............. 252/301.4 F; 313/503; 257/98

(58) Field of Classification Search ......... 252/301.4 F; 257/98; 313/503
    See application file for complete search history.

(56) References Cited

U.S. PATENT DOCUMENTS

| | | | |
|---|---|---|---|
| 3,790,490 A | 2/1974 | Datta et al. | |
| 4,710,033 A | 12/1987 | Hirano et al. | |
| 5,958,591 A | 9/1999 | Budd | |
| 5,959,316 A | 9/1999 | Lowery | |
| 5,998,925 A | 12/1999 | Shimizu et al. | |
| 6,066,861 A | 5/2000 | Hohn et al. | |
| 6,069,440 A | 5/2000 | Shimizu et al. | |
| 6,084,250 A | 7/2000 | Justel et al. | |
| 6,155,699 A | 12/2000 | Miller et al. | |
| 6,212,213 B1 | 4/2001 | Weber et al. | |
| 6,234,648 B1 | 5/2001 | Borner et al. | |
| 6,245,259 B1 | 6/2001 | Hohn et al. | |
| 6,252,254 B1 | 6/2001 | Soules et al. | |
| 6,255,670 B1 | 7/2001 | Srivastava et al. | |
| 6,273,589 B1 | 8/2001 | Weber et al. | |

(Continued)

FOREIGN PATENT DOCUMENTS

GB        864343    *  4/1961

(Continued)

OTHER PUBLICATIONS

Akella, A. and D.A. Keszler, "$Sr_2LiSiO_4F$: Synthesis, Structure, and $Eu^{2+}$ Luminescence," Chem. Mater. 7(7):1299-302 (1995).

(Continued)

*Primary Examiner*—C. Melissa Koslow
(74) *Attorney, Agent, or Firm*—Lowenstein Sandler PC

(57) ABSTRACT

Provided, among other things, is a phosphor according to the formula:

$$[(BvSiO_3)_x(Mv_2SiO_3)_y(Tv_2(SiO_3)_3)_z]_m \cdot (SiO_2)_n : R\epsilon, X \qquad (I)$$

wherein x, y and z are any value such that x+y+z=1; Bv is one or more divalent alkaline earth metals; Mv is one or more monovalent alkaline metals; Tv is one or more trivalent metal ions; Rε is one or more activators selected from $Eu^{2+}$ and $Mn^{2+}$; X is one or more halides; m is 1 or 0; and (i) n>3 if m=1 and provides an amount of silica effective to host useful luminescence or (ii) n=1 if m=0.

41 Claims, 8 Drawing Sheets

U.S. PATENT DOCUMENTS

| | | |
|---|---|---|
| 6,277,301 B1 | 8/2001 | Hohn et al. |
| 6,278,135 B1 | 8/2001 | Srivastava et al. |
| 6,294,800 B1 | 9/2001 | Duggal et al. |
| 6,303,403 B1 | 10/2001 | Sato et al. |
| 6,351,069 B1 | 2/2002 | Lowery et al. |
| 6,366,018 B1 | 4/2002 | Garbuzov et al. |
| 6,373,188 B1 | 4/2002 | Johnson et al. |
| 6,396,081 B1 | 5/2002 | Tews et al. |
| 6,417,019 B1 | 7/2002 | Mueller et al. |
| 6,429,583 B1 | 8/2002 | Levinson et al. |
| 6,501,100 B1 | 12/2002 | Srivastava et al. |
| 6,501,102 B2 | 12/2002 | Mueller-Mach et al. |
| 6,504,179 B1 | 1/2003 | Ellens et al. |
| 6,513,949 B1 | 2/2003 | Marshall et al. |
| 6,521,915 B2 | 2/2003 | Odaki et al. |
| 6,544,438 B2 | 4/2003 | Yocom et al. |
| 6,577,073 B2 | 6/2003 | Shimizu et al. |
| 6,586,882 B1 | 7/2003 | Harbers |
| 6,596,195 B2 | 7/2003 | Srivastava et al. |
| 6,603,258 B1 | 8/2003 | Mueller-Mach et al. |
| 6,616,862 B2 | 9/2003 | Srivastava et al. |
| 6,621,211 B1 | 9/2003 | Srivastava et al. |
| 6,632,379 B2 | 10/2003 | Mitomo et al. |
| 6,649,946 B2 | 11/2003 | Bogner et al. |
| 6,670,748 B2 | 12/2003 | Ellens et al. |
| 6,682,207 B2 | 1/2004 | Weber et al. |
| 6,682,663 B2 | 1/2004 | Botty et al. |
| 6,685,852 B2 | 2/2004 | Setlur et al. |
| 6,686,691 B1 | 2/2004 | Mueller et al. |
| 6,692,136 B2 | 2/2004 | Marshall et al. |
| 6,695,982 B2 | 2/2004 | Ellens et al. |
| 6,696,703 B2 | 2/2004 | Mueller-Mach et al. |
| 6,717,353 B1 | 4/2004 | Mueller et al. |
| 6,734,467 B2 | 5/2004 | Schlereth et al. |
| 6,773,629 B2 | 8/2004 | Le Mercier et al. |
| 6,783,700 B2 | 8/2004 | Tian et al. |
| 6,791,259 B1 | 9/2004 | Stokes et al. |
| 6,809,347 B2 | 10/2004 | Tosch et al. |
| 6,809,471 B2 | 10/2004 | Setlur et al. |
| 6,811,813 B1 | 11/2004 | Tian |
| 6,850,002 B2 | 2/2005 | Danielson et al. |
| 6,936,857 B2 | 8/2005 | Doxsee et al. |
| 6,939,481 B2 | 9/2005 | Srivastava et al. |
| 6,943,380 B2 | 9/2005 | Ota et al. |
| 6,982,523 B2 | 1/2006 | Odaki |
| 7,002,291 B2 | 2/2006 | Ellens et al. |
| 7,015,510 B2 | 3/2006 | Srivastava et al. |
| 7,018,565 B2 | 3/2006 | Tian et al. |
| 7,023,019 B2 | 4/2006 | Maeda et al. |
| 7,029,602 B2 | 4/2006 | Oshio |
| 7,064,480 B2 | 6/2006 | Booker et al. |
| 7,091,653 B2 | 8/2006 | Ouderkirk et al. |
| 7,091,661 B2 | 8/2006 | Ouderkirk et al. |
| 7,125,501 B2 | 10/2006 | Tian et al. |
| 2001/0038426 A1 | 11/2001 | Bechtel et al. |
| 2003/0146690 A1 | 8/2003 | Ellens et al. |
| 2003/0222268 A1 | 12/2003 | Yocom et al. |
| 2003/0227007 A1 | 12/2003 | Ezuhara et al. |
| 2003/0228412 A1 | 12/2003 | Chen |
| 2004/0116033 A1 | 6/2004 | Ouderkirk et al. |
| 2004/0135504 A1 | 7/2004 | Tamaki et al. |
| 2004/0145288 A1 | 7/2004 | Ouderkirk et al. |
| 2004/0145289 A1 | 7/2004 | Ouderkirk et al. |
| 2004/0145312 A1 | 7/2004 | Ouderkirk et al. |
| 2004/0145895 A1 | 7/2004 | Ouderkirk et al. |
| 2004/0145913 A1 | 7/2004 | Ouderkirk et al. |
| 2004/0150991 A1 | 8/2004 | Ouderkirk et al. |
| 2004/0159900 A1 | 8/2004 | Ouderkirk et al. |
| 2004/0164307 A1 | 8/2004 | Mueller-Mach et al. |
| 2004/0206973 A1 | 10/2004 | Tian et al. |
| 2004/0212291 A1 | 10/2004 | Keuper et al. |
| 2004/0227465 A1 | 11/2004 | Manakara et al. |
| 2004/0245532 A1 | 12/2004 | Maeda et al. |
| 2005/0184638 A1 | 8/2005 | Mueller et al. |
| 2005/0199897 A1 | 9/2005 | Setlur et al. |
| 2005/0205845 A1 | 9/2005 | Delsing et al. |
| 2005/0211992 A1 | 9/2005 | Nomura et al. |
| 2005/0218780 A1 | 10/2005 | Chen |
| 2005/0218781 A1 | 10/2005 | Chen |
| 2005/0224828 A1 | 10/2005 | Oon et al. |
| 2005/0230689 A1 | 10/2005 | Setlur et al. |
| 2005/0239227 A1 | 10/2005 | Aanegola et al. |
| 2006/0012284 A1 | 1/2006 | Kim et al. |
| 2006/0012287 A1 | 1/2006 | Tian et al. |
| 2006/0022582 A1 | 2/2006 | Radkov |
| 2006/0027781 A1 | 2/2006 | Dong et al. |
| 2006/0027785 A1 | 2/2006 | Wang et al. |
| 2006/0027786 A1 | 2/2006 | Dong et al. |
| 2006/0028122 A1 | 2/2006 | Wang et al. |
| 2006/0033081 A1 | 2/2006 | Hintzen et al. |
| 2006/0038477 A1 | 2/2006 | Tamaki et al. |
| 2006/0049414 A1 | 3/2006 | Chandran et al. |
| 2006/0055315 A1 | 3/2006 | Booker et al. |
| 2006/0061252 A1 | 3/2006 | Sohn et al. |
| 2006/0071589 A1 | 4/2006 | Radkov |
| 2006/0097245 A1 | 5/2006 | Aanegola et al. |
| 2006/0103291 A1 | 5/2006 | Ellens et al. |
| 2006/0113553 A1 | 6/2006 | Srivastava et al. |
| 2006/0145123 A1 | 7/2006 | Li et al. |
| 2006/0181192 A1 | 8/2006 | Radkov et al. |

FOREIGN PATENT DOCUMENTS

| | | |
|---|---|---|
| GB | 1087655 | 4/1965 |
| GB | 1087655 | * 10/1967 |
| GB | 1414381 | 11/1975 |
| JP | 2001 107036 | 4/2001 |
| KR | 2000 007067 | 2/2000 |
| WO | WO 1997/48138 | 12/1997 |
| WO | WO 2001/50500 | 7/2001 |
| WO | WO 2005/086239 | 9/2005 |
| WO | WO 2006/001297 | 1/2006 |
| WO | WO 2006/028104 | 3/2006 |

OTHER PUBLICATIONS

Bando, K., et al., "Development and Application of High Bright White LED Lamp," Tech Digest, Phosphor Res. Soc., 264th Meeting, 5-14 (Nov. 29, 1996). [In Japanese with English Summary].

Burrus, H. L. et al., "Fluorescence of $Eu^{2+}$ Activated Alkaline Earth Halosilicates," J. Luminescence 3: 467-76 (1971).

Czaya, V.R. and G. Bissert, "Die Kristallstruktur von Tricalciummonosilikatdichlorid ($Ca_2SiO_4$ $CaCl_2$), " Acta Cryst. B27:747-53 (1971). [In German with English Abstract].

Garcia, A. et al., "$Ba_5SiO_4Cl_6$:Eu, A New Blue-Emitting Photoluminescent Material with High Quenching Temperature," J. Electrochem, Soc.; Solid-State Science and Technology 126(10):1734-36 (Oct. 1979).

Golovastikov, N. I. And V. F. Kazak, "The Crystal Structure of Calcium Structure of Calcium Chlorosilicate $Ca_2SiO_3Ci_2$," Sov. Phys. Crystallogr. 22(5):549-51 (Sep.-Oct. 1977).

Hermomeit, B. et al., "Single Crystal Growth and Some Properties of the New Compound $Ca_3SiO_2O_7 1/3CaCl_2$," J. Cryst. Growth 52:660-62 (1981).

Lehmann, Willi, "Heterogeneous Halide-silica Phosphors", J. Electrochem. Soc. Solid-State Science and Technology, pp. 748-752, Jun. 1975.

Liu, J. et al., "$Eu^{2+}$ Doped High-Temperature Phase $Ca_3SiO_4Cl_2$: A Yellowish Orange Phosphor for White-Emitting Diodes," J. Electrochem. Soc., 152(11): G880-84 (2005).

Nakamura S., et al., "Superbright Green InGaN Single-Quantum-Well-Structure Light-Emitting Diodes," Jpn. J. Appl. Phys. (Letters) 34 (Pt. 2, No. 10B):L 1332-35 (Oct. 15, 1995).

Peters, T. E. and J. A. Baglio, "Luminescence and structural properties of thiogallate phosphors $Ce^{+3}$ and $Eu^{+2}$-activated phosphors. Part 1." J. Electrochem. Soc. 19(2):230-36 (1972).

Peters, T. E. "Luminescent properties of thiogallate phosphors: II $Ce^{+3}$-activated phosphors for flying spot applications," J. Electrochem. Soc. 119(12):1720-23 (1972).

Sun, J. et al., "Study on Luminescence Properties of Eu2+in (Sr, Ca)$_4$Si$_3$O$_8$Cl$_4$ Host Lattice," Guang Pu Xue Yu Guang Pu Fen Xi, 25(11):1760-63 (Nov. 2005). [In Chinese with English Abstract].

Wanmaker, W. L. and J. G. Verriet, "Luminescence of Phosphors with Ca$_3$SiO$_4$Cl$_2$ as the Host Lattice," Phillips Res. Repts. 28:80-83 (1973).

Winkler, A. et al., "On Chloride Silicates of Calcium, Strontium, and Barium," Z. Anorg. Allg. Chem. 504:89-94 (1983). [In German; German & English Abstracts Only].

Winlker, A. et al., "Two New Barium Bromide Silicates and the Molecular Constitution of their Silicate Anions," Z. Anorg. Allg. Chem. 542:131-36 (1986). [In German; German & English Abstracts Only].

Yen, W. M. and M. J. Weber, Inorganic Phosphors-Composition, Preparation and Optical Properties, CRC Press: Boca Raton, 2004, pp. 81-85.

Zhang, X. and X. Liu, "Luminescence Properties and Energy Transfer of $Eu^{2+}$Doped Ca$_8$Mg(SiO$_s$)$_4$Cl$_2$ Phosphors," J. Electrochem. Soc. 139(2):622-25 (Feb. 1992).

\* cited by examiner

METAL SILICATE-SILICA-BASED POLYMORPHOUS PHOSPHORS AND LIGHTING DEVICES

The present application claims priority benefit of U.S. Provisional Patent Application Ser. No. 60/684,373, filed May 24, 2005.

The present invention relates to metal silicate-silica-based, polymorphous phosphors, methods of making, and semiconductor lighting devices modified with the phosphors.

In lighting applications phosphors can be used to modify or manage the wavelength of light output. For example, with UV or blue light emitting diodes (LEDs) can be enhanced to produce visible light or less blue light by positioning phosphors along the emission pathway to convert light to longer wavelengths. Blue, green and red emitting phosphors can be used to modify UV to white light. Green and red emitting phosphors can be used to modify a blue output to white light. Yellow emitting phosphors can be mixed with light from a blue emitting diode or a blue emitting phosphor to create light of white chromaticity. The phosphors described here, when matched with appropriate light sources, can be used in such applications.

Near UV emitting solid state lighting devices incorporating semiconductor light sources (such as LEDs), hold the promise of producing light with sufficient efficiency that, with the light emission modified to the visible range with appropriate phosphors, they may be cost-effectively employed to provide a wide range of lighting devices for use in electronics as well as general illumination. The lattices of these semiconductor light emitting diode is typically InGaN-based doped by minor portions of magnesium to generate enough defects for radiation recombination of electrons and holes. For example, Nichia has made a 100 mW InGaN-based semiconductor light source designated NCCU033E, and an 85 mW GaN-based semiconductor light source designated NCCU001E. To utilize these near UV light sources in lighting products, phosphors with the appropriate excitation and emission characteristics are needed.

For near UV-LED devices, phosphors are used to convert the primary emission wavelength from 360 to 420 nm to visible light, especially to produce white light. These phosphors can be categorized into red-emitting, green-emitting and blue-emitting components. There are some existing phosphors, developed for other applications, which have an excitation profile to enable visible emission. Green-emitting examples include $(Ba_{1-x-y}Ca_xSr_y)_2(Mg_{1-z}Zn_z)Si_2O_7$:Eu; $Ca_8Mg(SiO_4)_4Cl_{12}$:Eu,Mn; $Ba_2SiO_4$:Eu, $Ba_2MgSi_2O_7$:Eu; $Ba_2ZnSi_2O_7$:Eu, $BaAl_2O_4$:Eu; $SrAl_2O_4$:Eu; $BaMg_2Al_{16}O_{27}$:Eu; and $Ca_8Mg(SiO_4)_4Cl_2$:Eu,Mn. Blue-emitting examples include $BaMg_2Al_{16}O_{27}$:Eu; $(Sr,Ba,Ca)_5(PO_4)_3Cl$:Eu and $Sr_4Al_{14}O_{25}$:Eu. These phosphors are fairly efficiently excited by near UV light in the wavelength ranging from 360 to 420 nm. Red-emitting examples include $Y_2O_2S$:Eu,Bi, $Y_2O_3$:Eu, Bi and $3.5MgO.0.5MgF_2.GeO_2$:Mn.

However, some of these phosphors are not ideally suited for wavelength conversion and in many cases have low efficiency when excited by a typical UV LED wavelength of 400 nm. Phosphors which are engineered to have the desired emission characteristics and which possess an excitation profile ideally suited for UV LEDs, are still needed.

Certain heterogeneous divalent europium and manganese activated, metal halide-silica phosphors have been described (Lehmann, *J. Elect. Soc.* 22:748–52, 1975), but with no description of use. The phosphors, which were doped with europium or europium plus manganese, were described as "luminescent halides dispersed in small segregations inside of bigger and nonluminescent $SiO_2$ particles." (Emphasis added.) According to the author, X-ray diffraction data "normally show only lines corresponding to the α-cristobalite modification of $SiO_2$. Whatever else is present must be either amorphous or in amounts too small to be detected by routine x-ray analysis (detectability limit: several %)." These phosphors have been described as being produced by firing in the presence of an excess of ammonium halide in a slightly reducing atmosphere. Attempts to reproduce this preparation method yielded explosions. The materials processed by the methods described below yielded product which XRD analysis has repeatedly shown to have a metal inosilicate and crystalline silica composition.

The metal silicate-silica-based, polymorphous phosphors are effectively used as wavelength converters with near UV or blue-emitting semiconductor or LED light sources. They can provide stable phosphors that are usefully excited with near UV, including red-emitting phosphors, pink-emitting phosphors, blue-emitting phosphors, and the like. Different phosphors of the present invention, or such phosphor(s) and other phosphors can be mixed to achieve different chromaticities, including white light.

EXEMPLARY EMBODIMENTS

A family of activated metal silicate-silica-based, polymorphous phosphors are believed to be useful for such applications. In one embodiment, the phosphors of the invention are according to the formula:

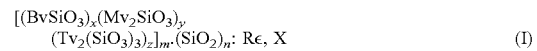
$$[(BvSiO_3)_x(Mv_2SiO_3)_y(Tv_2(SiO_3)_3)_z]_m \cdot (SiO_2)_n : R\epsilon, X \qquad (I)$$

wherein Bv is one or more divalent metal ions; Mv is one or more a monovalent ions; Tv is one or more trivalent metal ions; x, y and z are any value such that x+y+z=1; Rε is one or more activators selected from $Eu^{2+}$ and $Mn^{2+}$. X is one or more monovalent halides selected from $F^-$, $Cl^-$, $Br^-$ or $I^-$. RE is present, for example in an amount effective to provide luminescent emission. The value of m is 1 or 0. The value of n is >3 if m=1, and is such as to provide an amount of silica effective to host useful luminescence. The value of n is 1 if m=0. Bv, Mv and Tv are metal ions that support the formation of the metal silicates.

It is believed that where a mix of Mv and Bv, or Mv and Tv, or Bv and Tv, or Mv, Bv and Tv, is present, the Mv silicate, Bv silicate and Tv silicates are in separate crystalline phases. The metal silicate is believed to be in a separate phase from the silica $(SiO_2)_n$. The phases are separate in that they can be detected in XRD data.

The metal silicate is present in an amount that supports formation of other crystals in the host materials. Useful amounts are believed to include, for example, amounts from 1–10% of the phosphor composition. n describes an amount of matrix silica, which can be 100% amorphous, 100% cristobolite, contain quartz, or a mixture anywhere in between. The value of n can be determined from a compositional analysis and XRD estimation of the amount of $MSiO_3$.

In one embodiment, Bv is an alkaline earth metal ion, such as one or more of ions of Be, Mg, Ca, Sr or Ba. In one embodiment, Bv is one or more of ions of Ti, V, Cr, Mn, Fe, Co, Ni, Cu, Zn, Zr, Nb, Mo, Ru, Rh, Pd, Ag, Cd, Ta, W, Re, Os, Ir, Pt, Au or Hg. In one embodiment, Bv is one or more of ions of Be, Mg, Ca, Sr, Ba, Mn, Co, Ni, Cu, Zn, Cd or Hg.

In one embodiment, Tv is one or more ions of Al, Ga, In, Sc, Y or La. In one embodiment, Mv is one or more alkali metal ions, such as Li, Na or K.

The composition can be very stable, in that it retains 85% or more, 86% or more, 87% or more, 88% or more, 89% or more, 90% or more, 91% or more, or 92% or more of its relative emission intensity after 400 hours at 85° C. in the presence of 85% relative humidity.

In certain embodiments, the mole percentage of Rϵ in the composition is 0.001% to 10% of silica ($SiO_2$) (or, in some embodiments, of formula components). In certain embodiments, the range of the mole percentage of Rϵ is from one of the following lower endpoints (inclusive) or from one of the following upper endpoints (inclusive). The lower endpoints are 0.001%, 0.01%, 0.02%, 0.05%, 0.1%, 0.2%, 0.5%, 1%, 2%, 3%, 4% and 5%. The upper endpoints are 0.01%, 0.02%, 0.05%, 0.1%, 0.2%, 0.5%, 1%, 2%, 3%, 4%, 5% and 10%. For example, the range can be 0.01% to 5%.

In certain embodiments, the mole percentage of X in the composition is 0.002% to 5% of silica ($SiO_2$) (or, in some embodiments, of formula components). In certain embodiments, the range of the mole percentage of Rϵ is from one of the following lower endpoints (inclusive) or from one of the following upper endpoints (inclusive). The lower endpoints are 0.002%, 0.01%, 0.02%, 0.05%, 0.1%, 0.2%, 0.5%, 1%, 2%, 3% and 4%. The upper endpoints are 0.01%, 0.02%, 0.05%, 0.1%, 0.2%, 0.5%, 1%, 2%, 3%, 4% and 5%. For example, the range can be 0.01% to 5%.

In certain embodiments, the mole percentage of $BvSiO_3$ and/or $Mv_2SiO_3$ and/or $Tv_2(SiO_3)_3$ is 0.1% to 40% of silica ($SiO_2$) (or, in some embodiments, of formula components). In certain embodiments, the range of the mole percentage of $BvSiO_3$ and/or $MvSiO_3$ and/or $Tv_2(SiO_3)_3$ is from one of the following lower endpoints (inclusive) or from one of the following upper endpoints (inclusive). The lower endpoints are 0.1%, 0.2%, 0.3%, 0.4%, 0.5%, 0.7%, 1%, 2%, 5%, 10%, 15%, 20%, 30% and 40%. The upper endpoints are 0.2%, 0.3%, 0.4%, 0.5%, 0.7%, 1%, 2%, 5%, 10%, 15%, 20%, 30%, 40% and 50%. For example, the range can be 5% to 10%.

In certain embodiments, x=1. In certain embodiments, y=1. In certain embodiments, z=1. In certain embodiments, one or two of x, y and z are zero.

In certain embodiments, X is a halide and is 99.9% (molar) or more of a given halide, such as 99.9% (molar) or more chloride, or 99.9% (molar) or more iodide, or 99.9% (molar) or more bromide. X is generally present in an amount that charge neutralizes Rϵ.

DETAILED DESCRIPTION OF THE INVENTION

Figure 1:
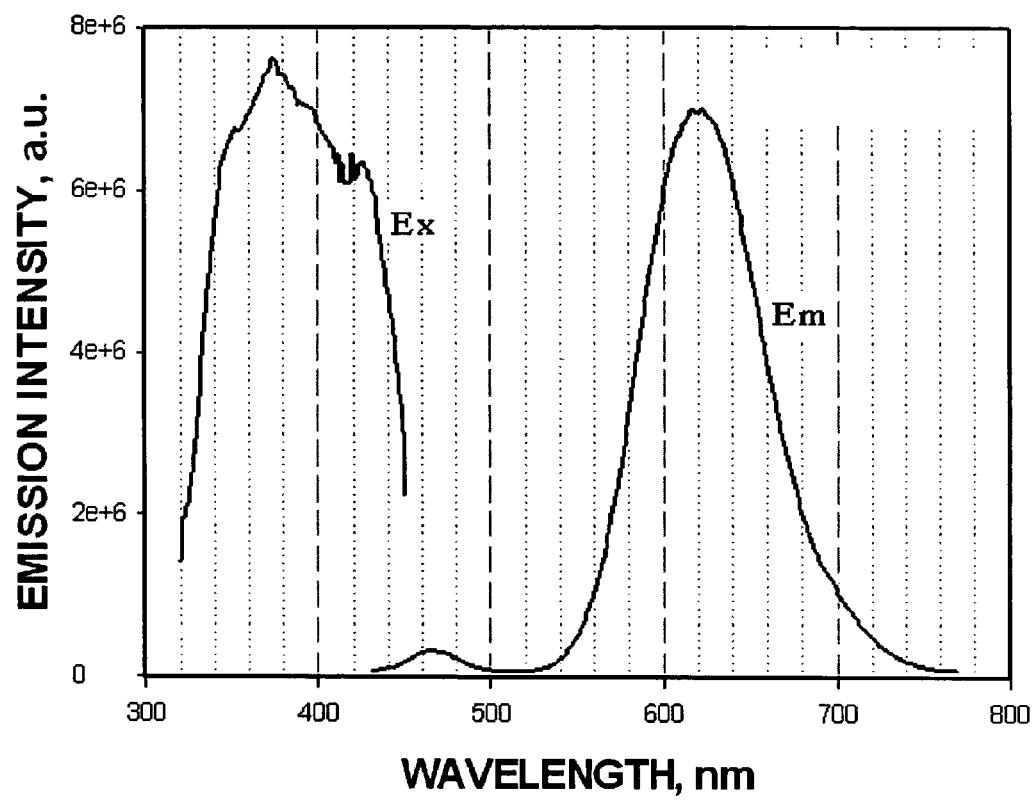
FIGS. 1 (Ex. 1), 4 (Ex. 2), 5 (Ex. 3), 7 (Ex. 4), 8 (Ex. 5), 10 (Ex. 6), 11 (Ex. 7) and 12 (Ex. 8) show excitation and emission spectra of phosphors of the invention.

The host material of the phosphors is believed to be polymorphous metal silicates and silica. The silica, $SiO_2$, constitutes the greater part of the host materials. The silica can be crystallized in cristobalite which is made from $SiO_4$ tetrahedral units fused together by sharing oxygen atoms. The crystal can have the space group of $P4_32_12$ of tetragonal system. The silica can also be present in quartz or amorphous forms. The metal silicates, $BvSiO_3$ and $Mv_2SiO_3$, are believed to be in the form of inosilicates in which tetrahedral polymerization is based upon ($SiO_3$), as in the pyroxene jadeite, $NaAl[Si_2O_6]$, and double chain silicates with tetrahedral polymerization, as found in the amphilbole glaucophane. Typically, the ($SiO_3$) units form single chains by sharing an oxygen atom of the $SiO_4$ tetrahedra, and the single chains repeat their tetrahedral growth or translation pattern in multiples of three forming wollastonite, calcite or enstalite.

A reaction in forming the phosphor at high temperature is considered to be, in a number of embodiments of the invention, the crystallization of silica into cristobalite, while incorporating activators $Eu^{2+}$ and/or $Mn^{2+}$ in the crystals. This reaction is supported by a medium that at the firing temperature is liquid. In other words, by a "flux". There are other types of metal silicates that can be molten in the temperature range for the crystallization. These silicates can function as flux providing the fluid medium at the temperatures of, for example, ~900 to ~1300° C.

Synthesis can, for example, include: (1) mixing appropriate precursors (e.g., the metal carbonates and/or metal nitrates and/or metal oxides, and/or metal halides—such as fluorides, and/or a source of halide X), where at some point in the mixing a slurry can be used to ensure the intimate contact of the reactant ingredients ready for the solid-state chemical reactions; (2) optionally milling the mixture to achieve further contact at a fine particle level of the inorganic solids; (3) optionally drying the mixed material, (4) optionally heating under a reducing gas, such as, for example, hydrogen at a given first temperature, (5) optionally mixing in further precursor of X if a source of halide X was included in the precursors forming a slurry, (6) firing at a temperature higher than the given first temperature, under a reducing gas, (7) optionally washing the phosphor with a solvent effective to wash out unreacted ingredients, and (8) optionally applying a post formation treatment such as sieving or size separation.

It will be recognized that the materials provided in the forming reaction may not altogether convert to the forms of formula I, and that all unreacted materials may not wash out (if a washing step is used). However, it is believed that formula I describes the significant hosting and flux providing phases of the phosphor.

The first temperature can be at, for example, 700 to 1100° C. For example, it can be a range from 700° C., 710° C., 720° C., 730° C., 740° C., 750° C., 760° C., 770° C., 780° C., 790° C., 800° C., 810° C., 820° C., 830° C., 840° C., 850° C., 860° C., 870° C., 880° C., 890° C., 900° C., 910° C., 920° C., 930° C., 940° C., 950° C., 960° C., 970° C., 980° C., 990° C. or 1000° C. upwards. Or a range from 1100° C., 1090° C., 1080° C., 1070° C., 1060° C., 1050° C., 1040° C., 1030° C., 1020° C., 1010° C., 1000° C., 990° C., 980° C., 970° C., 960° C., 950° C., 940° C., 930° C., 920° C., 910° C., 900° C., 890° C., 880° C., 870° C., 860° C., 850° C., 840° C., 830° C., 820° C., 810° C., 800° C. downwards.

The firing can be at, for example, 900 to 1300° C. For example, it can be a range from 900° C., 910° C., 920° C., 930° C., 940° C., 950° C., 960° C., 970° C., 980° C., 990° C., 1000° C., 1010° C., 1020° C., 1030° C., 1040° C., 1050° C., 1060° C., 1070° C., 1080° C., 1090° C., 1100° C., 1110°

C., 1120° C., 1130° C., 1140° C., 1150° C., 1160° C., 1170° C., 1180° C., 1190° C., or 1200° C., upwards. Or a range from 1300° C., 1290° C., 1280° C., 1270° C., 1260° C., 1250° C., 1240° C., 1230° C., 1220° C., 1210° C., 1200° C., 1190° C., 1180° C., 1170° C., 1160° C., 1150° C., 1140° C., 1130° C., 1120° C., 1110° C., 1100° C., 1090° C., 1080° C., 1070° C., 1060° C., 1050° C., 1040° C., 1030° C., 1020° C., 1010° C. or 1000° C. downwards. The firing can be, for example, at a temperature 40° C. or more, 50° C. or more, 60° C. or more, 70° C. or more, 48° C. or more, 90° C. or more, or 100° C. or more higher than the flux temperature.

In certain embodiments, the $SiO_2$ component is substantially 0% cristobolite, and the rest amorphous or quartz, or a given molar percent or more cristobolite, and the rest amorphous or quartz. The given percent can be, for example, 1, 2, 3, 4, 5, 10, 15, 20, 25, 30, 35, 40, 45, 50, 55, 60, 65, 70, 75, 80, 85, 90, 95 or 100%. Or, $SiO_2$ component can be a given percentage or less cristobolite. The second given percent can be, for example, 1, 2, 3, 4, 5, 10, 15, 20, 25, 30, 35, 40, 45, 50, 55, 60, 65, 70, 75, 80, 85, 90 or 95%.

In certain embodiments x is substantially 1. In other embodiments, x is substantially 0. In certain embodiments z is substantially 0. In certain embodiments, z=0, and x or y is 0.50 or less, 0.49 or less, 0.48 or less, 0.47 or less, 0.46 or less, and so on by 0.01 increments to 0.01 or less. In certain embodiments x or y or z is 0.50 or less, 0.49 or less, 0.48 or less, 0.47 or less, 0.46 or less, and so on by 0.01 increments to 0.01 or less.

In certain embodiments, the quantum efficiency of phosphors of the invention is 40% or more.

The emission peak of metal silicate-silica-based, polymorphous phosphors of the invention is measured with the excitation source being light at 300–500 nm±10 nm. In certain embodiments, the emission peak range is from one of the following lower endpoints (inclusive) or from one of the following upper endpoints (inclusive). The lower endpoints are 360, 361, 362, 363, and each one nm increment up to 799 nm. The upper endpoints are 800, 799, 798, 797, and each one nm down to 361.

In some embodiments, the lower endpoints are 430, 431, 432, and each one nm increment up to 489 nm. In some embodiments, the upper endpoints are 490, 489, 488, and each one nm increment down to 431 nm.

In some embodiments, the lower endpoints are 500, 501, 502, and each one nm increment up to 559 nm. In some embodiments, the upper endpoints are 560, 559, 558, and each one nm increment down to 501 nm.

In some embodiments, the lower endpoints are 590, 591, 592, and each one nm increment up to 659 nm. In some embodiments, the upper endpoints are 660, 659, 658, and each one nm increment down to 591 nm.

In certain embodiments, the phosphor is effectively excited (sufficiently for use with a corresponding semiconductor light emitting device) with light of wavelength from 400 to 420 nm.

$R\epsilon$ is substantially composed of all Eu or Mn or both, but minor amounts, such as 4% or less, 2% or less, 1% or less, 0.5% or less, 0.4% or less, 0.3% or less, 0.2% or less, or 0.1% or less of activators, may be other activator(s).

Among candidate metal ions M, ions of Mg and Ba are less preferred. In certain embodiments, M is 99% (molar) or more, 99.1% or more, 99.5% or more, 99.7% or more, 99.8% or more, 99.8% or more, or 99.9% or more of one metal (such as, for example, Ca).

In certain embodiments, the phosphor is according to $(CaSiO_3)_m \cdot (SiO_2)_n : Eu^{2+}, Mn^{2+}, I^-$, where m and n are as previously defined and the concentration and ratio of $Eu^{2+}$ and $Mn^{2+}$ are selected to provide a peak emission between 600 nm and 640 nm or 620 nm and 660 nm (or an included range to one of the foregoing ranges), and a chromaticity of x=0.62±0.06, y=0.30±0.06.

In certain embodiments, the phosphor is according to $(CaSiO_3)_m \cdot (SiO_2)_n : Eu^{2+}, I^-$, were m and n are as previously defined and the concentration of $Eu^{2+}$ is selected to provide a peak emission between 445 nm and 480 nm or 455 nm and 475 nm or 445 nm and 475 nm (or an included range to one of the foregoing ranges), and a chromaticity of x=0.20±0.06, y=0.10±0.06.

In certain embodiments, the phosphor is according to $(CaSiO_3)_m \cdot (SiO_2)_n : Eu^{2+}, Mn^{2+}, Cl^-$, where m and n are as previously defined and the concentration and ratio of $Eu^{2+}$ and $Mn^{2+}$ are selected to provide a chromaticity of x=0.40±0.06, y=0.20±0.06.

When used in a lighting device, it will be recognized that the phosphors can be excited by light from a primary source, such as an semiconductor light source emitting in the wavelength of 300–420 nm, or from secondary light such as emissions from other phosphor(s) emitting in the same wavelength range. Where the excitation light is secondary, in relation to the phosphors of the invention, the excitation-induced light is the relevant source light. Devices that use the phosphor of the invention can include mirrors, such as dielectric mirrors, to direct light produced by the phosphors to the light output rather than the interior of the device (such as the primary light source).

The semiconductor light source can, in certain embodiments, emit light of 300 nm or more, or 305 nm or more, or 310 nm or more, and so on in increments of 5 nm to 400 nm or more. The semiconductor light source can, in certain embodiments, emit light of 420 nm or less, or 415 nm or less, or 410 nm or less, and so on in increments of 5 nm to 350 nm or less.

Phosphor particles may be dispersed in the lighting device with a binder or solidifier, dispersant (i.e., light scattering material), filler or the like, The binder can be, for example, a light curable polymer such as an acrylic resin, an epoxy resin, polycarbonate resin, a silicone resin, glass, quartz and the like. The phosphor can be dispersed in the binder by methods known in the art. For example, in some cases the phosphor can be suspended in a solvent, and the polymer suspended, dissolved or partially dissolved in the solvent, the slurry dispersed on the lighting device, and the solvent evaporated. In some cases, the phosphor can be suspended in a liquid, pre-cured precursor to the resin, the slurry dispersed, and the polymer cured. Curing can be, for example, by heat, UV, or a curing agent (such as a free radical initiator) mixed in the precursor. Or, in another example, the binder may be liquefied with heat, a slurry formed, and the slurry dispersed and allowed to solidify in situ. Dispersants include, for example, titanium oxide, aluminum oxide, barium titanate, silicon dioxide, and the like.

It is anticipated that lighting devices of the invention will use semiconductor light sources such as LEDs to either create excitation energy, or excite another system to provide the excitation energy for the phosphors. Devices using the invention can include, for example, white light producing lighting devices, indigo light producing lighting devices, blue light producing lighting devices, green light producing lighting devices, yellow light producing lighting devices, orange light producing lighting devices, pink light producing lighting devices, red light producing lighting devices, or lighting devices with an output chromaticity defined by the line between the chromaticity of a phosphor of the invention and that of one or more second light sources. Headlights or other navigation lights for vehicles can be made with the devices of the invention. The devices can be output indicators for small electronic devices such as cell phones and PDAs. The lighting devices can also be the backlights of the liquid crystal displays for cell phones, PDAs and laptop computers. Given appropriate power supplies, room lighting can be based on devices of the invention. The warmth (i.e., amount of yellow/red chromaticity) of lighting devices can be tuned by selection of the ratio of light from phosphor of the invention to light from a second source.

Suitable semiconductor light sources are any that create light that excites the phosphors, or that excites a phosphor that in turn excites the phosphors of the invention. Such semiconductor light sources can be, for example, Ga—N type semiconductor light sources, In—Al—Ga—N type semiconductor light sources, and the like. In some embodiments, blue or near UV emitting semiconductor light sources are used.

For a semiconductor light source having a using at least two different phosphors, it can be useful to disperse the phosphors separately, and superimpose the phosphor layers instead of dispersing the phosphors together in one matrix. Such layering can be used to obtain a final light emission color by way of a plurality of color conversion processes. For example, the light emission process is: absorption of the semiconductor light source light emission by a first phosphor, light emission by the first phosphor, absorption of the light emission of the first phosphor by a second phosphor, and the light emission by the second phosphor.

Figure 15:
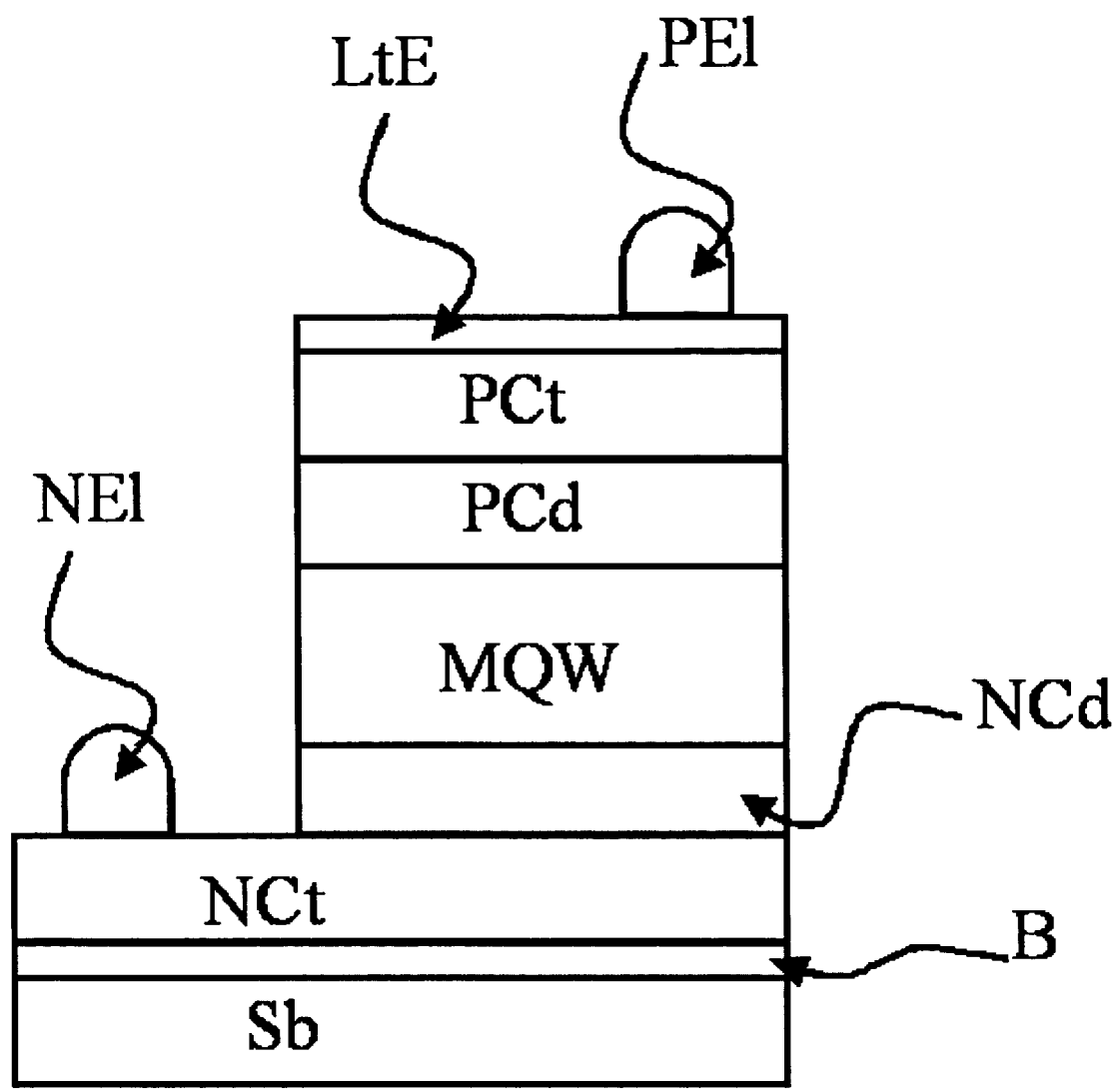
FIG. 15 illustrates an exemplary layer structure for a near UV emitting semiconductor light source.

FIG. 15 shows an exemplary layer structure of a semiconductor light source. The blue semiconductor light comprises a substrate Sb, for example, a sapphire substrate. For example, a buffer layer B, an n-type contact layer NCt, an n-type cladding layer NCd, a multi-quantum well active layer MQW, a p-type cladding layer PCd, and a p-type contact layer PCt are formed in that order as nitride semiconductor layers. The layers can be formed, for example, by organometallic chemical vapor deposition (MOCVD), on the substrate Sb. Thereafter, a light-transparent electrode LtE is formed on the whole surface of the p-type contact layer PCt, a p electrode PEl is formed on a part of the light-transparent electrode LtE, and an n electrode NEl is formed on a part of the n-type contact layer NCt. These layers can be formed, for example, by sputtering or vacuum deposition.

The buffer layer B can be formed of, for example, AlN, and the n-type contact layer NCt can be formed of, for example, GaN.

The n-type cladding layer NCd can be formed, for example, of $Al_rGa_{1-r}N$ wherein $0 \leq r<1$, the p-type cladding layer PCd can be formed, for example, of $Al_qGa_{1-q}N$ wherein $0<q<1$, and the p-type contact layer PCt can be formed, for example, of $Al_sGa_{1-s}N$ wherein $0 \leq s<1$ and $s<q$. The band gap of the p-type cladding layer PCd is made larger than the band gap of the n-type cladding layer NCd. The n-type cladding layer NCd and the p-type cladding layer PCd each can have a single-composition construction, or can have a construction such that the above-described nitride semiconductor layers having a thickness of not more than 100 angstroms and different from each other in composition are stacked on top of each other so as to provide a superlattice structure. When the layer thickness is not more than 100 angstroms, the occurrence of cracks or crystal defects in the layer can be prevented.

The multi-quantum well active layer MQW can be composed of a plurality of InGaN well layers and a plurality of GaN barrier layers. The well layer and the barrier layer can have a thickness of not more than 100 angstroms, preferably 60 to 70 angstroms, so as to constitute a superlattice structure. Since the crystal of InGaN is softer than other aluminum-containing nitride semiconductors, such as AlGaN, the use of InGaN in the layer constituting the active layer MQW can offer an advantage that all the stacked nitride semiconductor layers are less likely to crack. The multi-quantum well active layer MQW can also be composed of a plurality of InGaN well layers and a plurality of AlGaN barrier layers. Or, the multi-quantum well active layer MQW can be composed of a plurality of AlInGaN well layers and a plurality of AlInGaN barrier layers. In this case, the band gap energy of the barrier layer can be made larger than the band gap energy of the well layer.

A reflecting layer can be provided on the substrate Sb side from the multi-quantum well active layer MQW, for example, on the buffer layer B side of the n-type contact layer NCt. The reflecting layer can also be provided on the surface of the substrate Sb remote from the multi-quantum well active layer MQW stacked on the substrate Sb. The reflecting layer can have a maximum reflectance with respect to light emitted from the active layer MQW and can be formed of, for example, aluminum, or can have a multi-layer structure of thin GaN layers. The provision of the reflecting layer permits light emitted from the active layer MQW to be reflected from the reflecting layer, can reduce the internal absorption of light emitted from the active layer MQW, can increase the quantity of light output toward above, and can reduce the incidence of light on the mount for the light source to prevent a deterioration.

Figure 13:
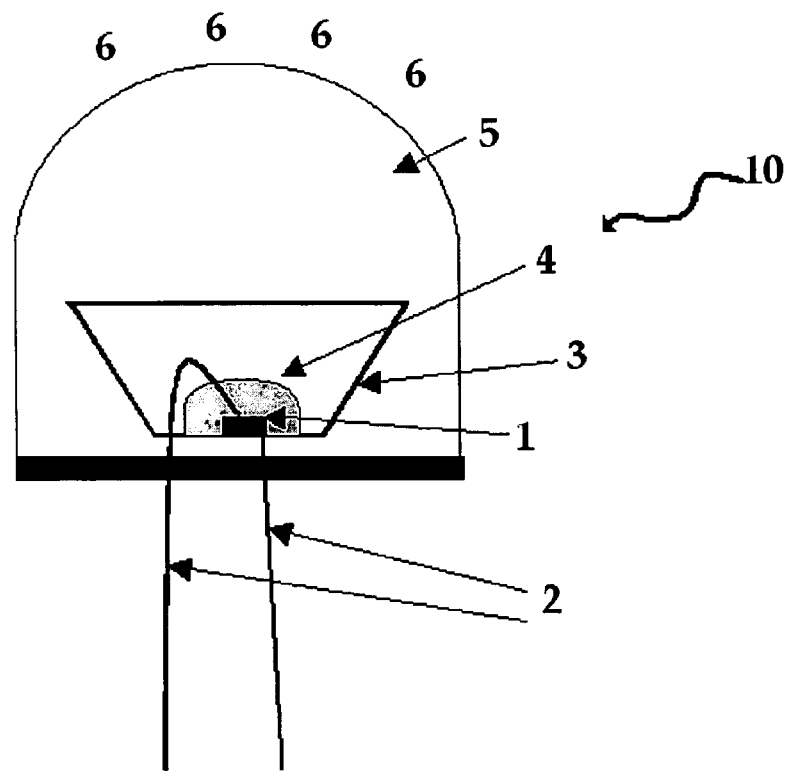
FIGS. 13 and 14 show light emitting devices.
Figure 14:
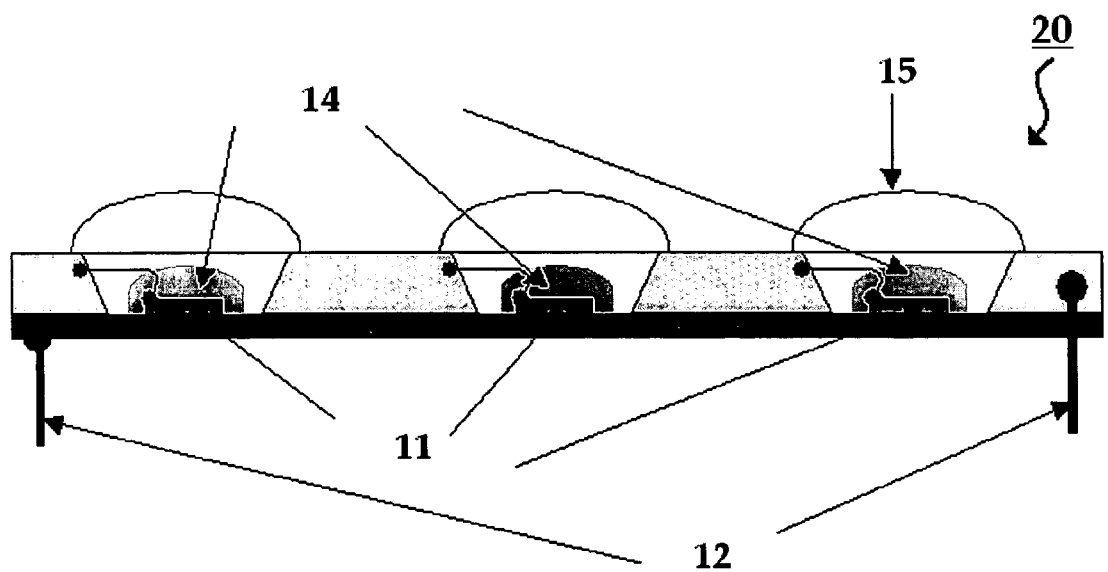

Shown in FIGS. 13–14 are some exemplary semiconductor light source-phosphor structures. FIG. 13 shows a light emitting device 10 with an semiconductor light source chip 1 powered by leads 2, and having phosphor-containing material 4 secured between the semiconductor light source chip and the light output 6. A reflector 3 can serve to concentrate light output. A transparent envelope 5 can isolate the semiconductor light source and phosphor from the environment and/or provide a lens. The lighting device 20 of FIG. 14 is a panel device having multiple semiconductor light source chips 11, leads 12, phosphor-containing material 14, and transparent envelope 15.

It will be understood by those of ordinary skill in the art that there are any number of ways to associate phosphors with an semiconductor light source such that light from the semiconductor light source is managed by its interaction with the phosphors. U.S. Patent Applications 2004/0145289 and 2004/0145288 illustrate lighting devices where phosphor is positioned away from the light output of the semiconductor light sources. U.S. Patent Applications 2004/01450307 and 2004/0159846 further illustrate, without limitation, lighting devices that can be used in the invention.

Semiconductor light source-based white light devices can be used, for example, in a self-emission type display for displaying a predetermined pattern or graphic design on a display portion of an audio system, a household appliance, a measuring instrument, a medical appliance, and the like. Such semiconductor light source-based light devices can also be used, for example, as light sources of a back-light for LCD displays, a printer head, a facsimile, a copying apparatus, and the like.

Among the additional phosphors that can be mixed with phosphors of the invention, some of those believed to be useful include those identified above in the initial paragraphs of this specification.

Among the additional phosphors that can be mixed with phosphors of the invention, some of those believed to be useful include: $Y_3Al_5O_{12}$:$Ce^{3+}$ (YAG), $Lu_3Ga_2(AlO_4)_3$:$Ce^{3+}$; $La_3In_2(AlO_4)_3$:$Ce^{3+}$; $Ca_3Ga_5O_{12}$:$Ce^{3+}$; $Sr_3Al_5O_{12}$:$Tb^{3+}$; $BaYSiAlO_{12}$:$Ce^{3+}$; $CaGa_2S_4$:$Eu^{2+}$; $SrCaSiO_4$:$Eu^{2+}$; ZnS:Cu, $CaSi_2O_2N$:$Eu^{2+}$; $SrSi_2O_2N$:$Eu^{2+}$; $SrSiAl_2O_3N_2$:$Eu^{2+}$; $Ba_2MgSi_2O_7$:$Eu^{2+}$; $Ba_2SiO_4$:$Eu^{2+}$; $La_2O_3.11Al_2O_3$:$Mn^{2+}$; $Ca_8Mg(SiO_4)_4Cl_2$:$Eu^{2+}$, $Mn^{2+}$; $(CaM)(Si,Al)_{12}(O,N)_{16}$:$Eu^{2+}$,$Tb^{3+}$,$Yb^{3+}$; $YBO_3$:$Ce^{3+}$,$Tb^{3+}$; $BaMgAl_{10}O_{17}$:$Eu^{2+}$,$Mn^{2+}$; $(Sr,Ca,Ba)(Al,Ga)_2S_4$:$Eu^{2+}$; $BaCaSi_7N_{10}$:$Eu^{2+}$; $(SrBa)_3MgSi_2O_8$:$Eu^{2+}$; $(SrBa)_2P_2O_7$:$Eu^{2+}$; $(SrBa)_2Al_{14}O_{25}$:$Eu^{2+}$; $LaSi_3N_5$:$Ce^{3+}$; $(BaSr)MgAl_{10}O_{17}$:$Eu^{2+}$; and $CaMgSi_2O_7$:$Eu^{2+}$.

Temperatures described herein for synthetic processes involving a substantial gas phase are of the oven or other reaction vessel in question, not of the reactants per se.

"White" light is light that of certain chromaticity values (known and well published in the art).

The following examples further illustrate the present invention, but of course, should not be construed as in any way limiting its scope. In the following examples, m and n are as previously defined.

EXAMPLE 1a

Figure 2:
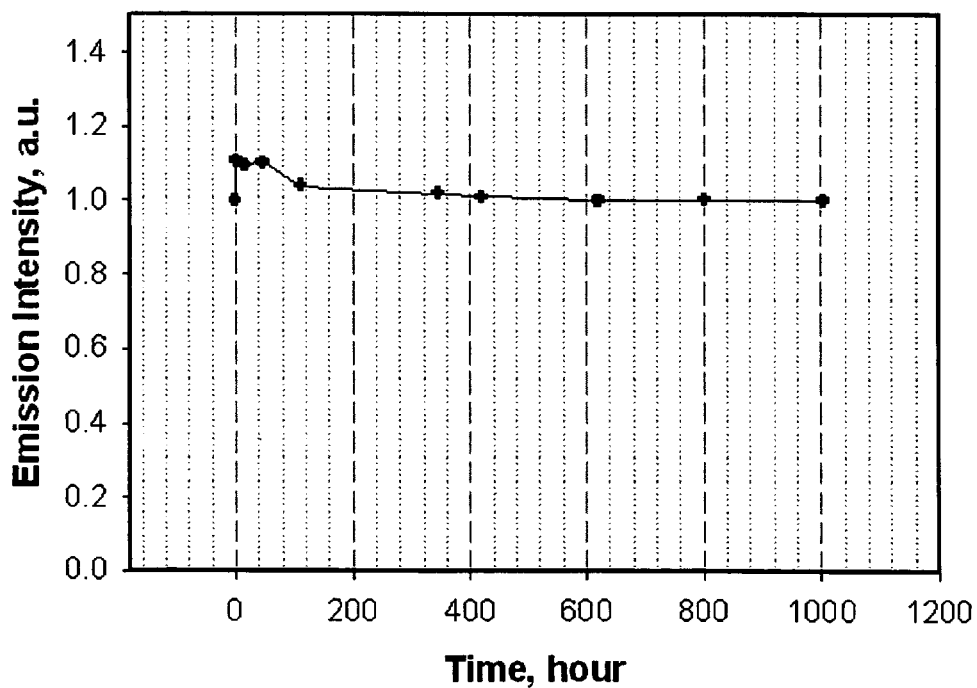
FIGS. 2 (Ex. 1) and 6 (Ex. 3) show stability data for phosphors of the invention.
Figure 3:
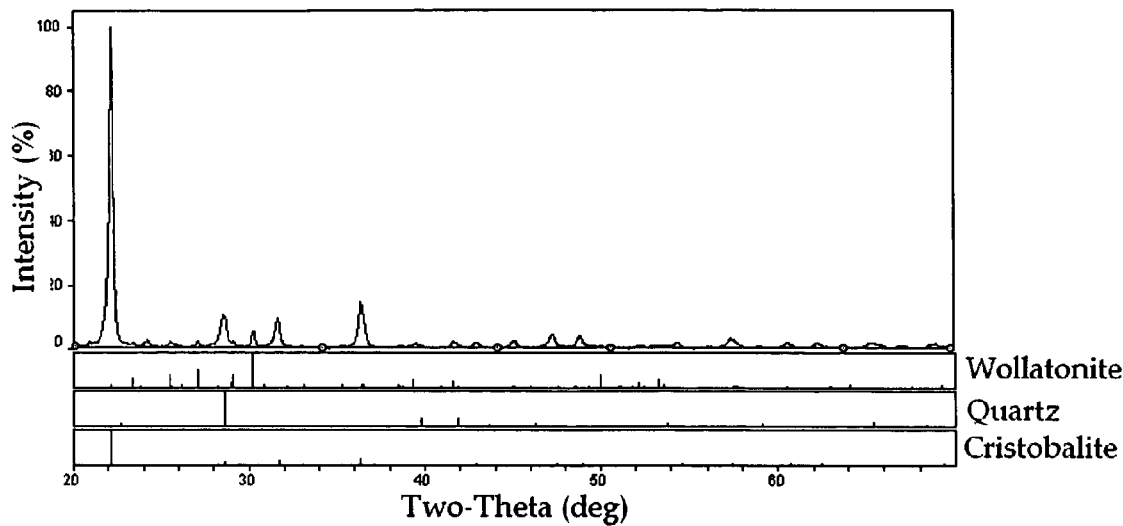
FIGS. 3 (Ex. 1) and 9 (Ex. 5) show X-ray diffraction data for phosphors of the invention.

Preparation of $(CaSiO_3)_m.(SiO_2)_n$:$Eu^{2+}$, $Mn^{2+}$, I 1.14 g of $Eu_2O_3$, (0.65 mole %), 3.9 g of CaO (7 mole %), 0.78 g of $CaF_2$ (1 mole %), 0.115 g of $MnCO_3$ (0.1 mole %), 60.08 g of silicic acid (100 mole %) and 21 g of $NH_4I$ (14.4 mole %) were mixed in dry powder form. The mixed powder was further dried in dry nitrogen at 140° C. for 4 hours. The powder was then fired at 900° C. in forming gas (5% v/v $H_2$ in $N_2$) for 1 hour. After the material cooled down, 14 g of $NH_4I$ was added and mixed again. The mixed powder was fired at 1000° C. in forming gas for 1 hour. The phosphor obtained was $(CaSiO_3)_m.(SiO_2)_n$:$Eu^{2+}$, $Mn^{2+}$, $I^-$. The silica, $SiO_2$, was in cristobalite form and the calcium inosilicate was in the Wollastonite form, as evidenced by X-ray diffraction pattern shown in FIG. 3 (shown relative to Wollastonite inosilicate, to quartz, and to cristobalite silica). The phosphor emitted bright red light peaking at 635 nm upon 410 nm light excitation, as shown in FIG. 1. The long term stability (longevity) of the phosphor when subjected to 85° C. and 85% relative humidity is shown in FIG. 2.

EXAMPLE 1b-f

Preparation of $(CaSiO_3)_m.(SiO_2)_n$:$Eu^{2+}$, $Mn^{2+}$, I

The method of Example 1a was used, except that the ratio of $Eu^{2+}$ and $Mn^{2+}$ were varied to obtain the following phosphors:

| | Phosphor Formula | $[Eu^{2+}]$, mol % | $[Mn^{2+}]$, mol % | Emitting Color |
|---|---|---|---|---|
| b | $(CaSiO_3)_m.(SiO_2)_n$:$Eu^{2+}$, $Mn^{2+}$, $I^-$. | 0.65 | 0.05 | Pink |
| c | $(CaSiO_3)_m.(SiO_2)_n$:$Eu^{2+}$, $Mn^{2+}$, $I^-$. | 0.65 | 0.1 | Pink |
| d | $(CaSiO_3)_m.(SiO_2)_n$:$Eu^{2+}$, $Mn^{2+}$, $I^-$. | 0.65 | 0.15 | Pink |
| e | $(CaSiO_3)_m.(SiO_2)_n$:$Eu^{2+}$, $Mn^{2+}$, $I^-$. | 0.65 | 0.2 | Red |
| f | $(CaSiO_3)_m.(SiO_2)_n$:$Eu^{2+}$, $Mn^{2+}$, $I^-$. | 0.65 | 0.5 | Red |

EXAMPLE 2

Figure 4:
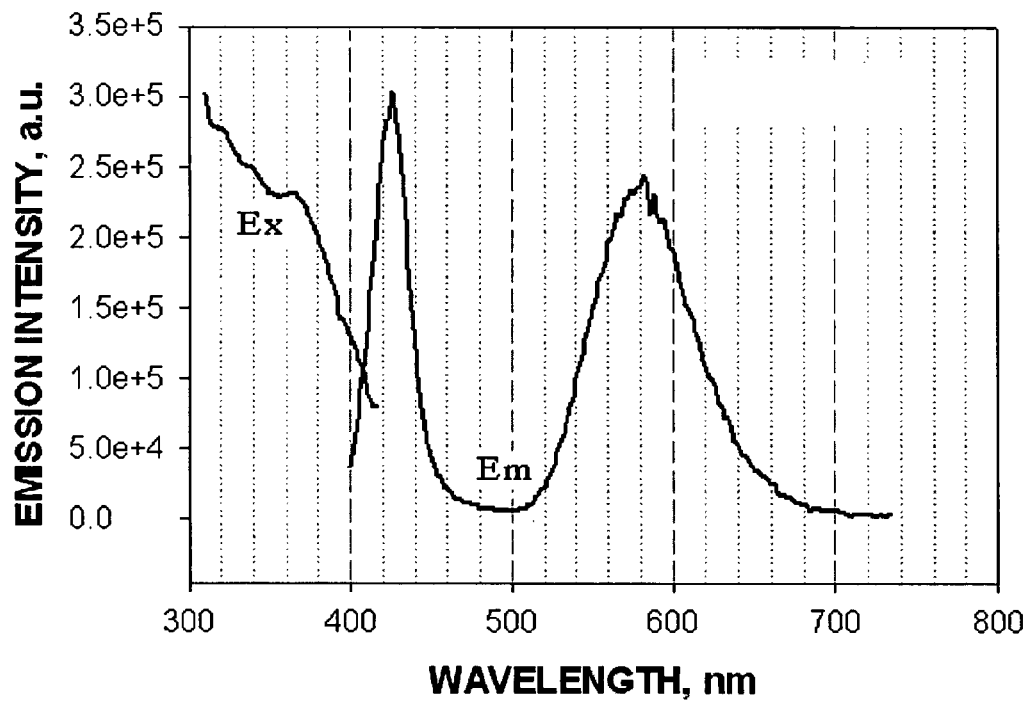

Preparation of $(CaSiO_3)_m.(SiO_2)_n$:$Eu^{2+}$, $Mn^{2+}$, Cl 1.14 g of $Eu_2O_3$, (0.65 mole %), 3.9 g of CaO (7 mole %), 0.78 g of $CaF_2$ (1 mole %), 0.115 g of $MnCO_3$ (0.1 mole %), 60.08 g of silicic acid (100 mole %) and 14 g of $NH_4Cl$ (26 mol %) were mixed by dry grinding. The mixed powder was further dried in dry nitrogen at 140° C. for 4 hours. The powder was then fired at 900° C. in dry nitrogen for 1 hour. After the material cooled down to room temperature, 14 g of $NH_4Cl$ were added and the material mixed once again. The mixed powder was then fired at 1000° C. in forming gas for 1 hour. The phosphor obtained was $(CaSiO_3)_m.(SiO_2)_n$:$Eu^{2+}$, $Mn^{2+}$, $Cl^-$. The phosphor emitted bright orange-red light peaking at 422 nm and 585 nm upon 410 mm light excitation, as shown in FIG. 4.

EXAMPLE 3a

Figure 5:
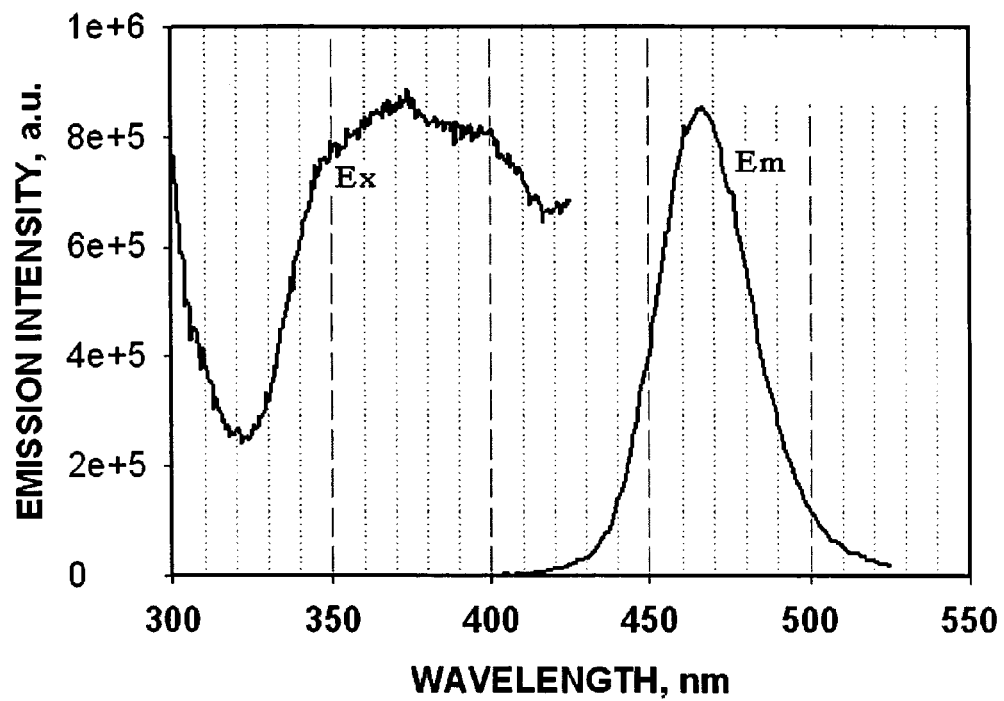
Figure 6:
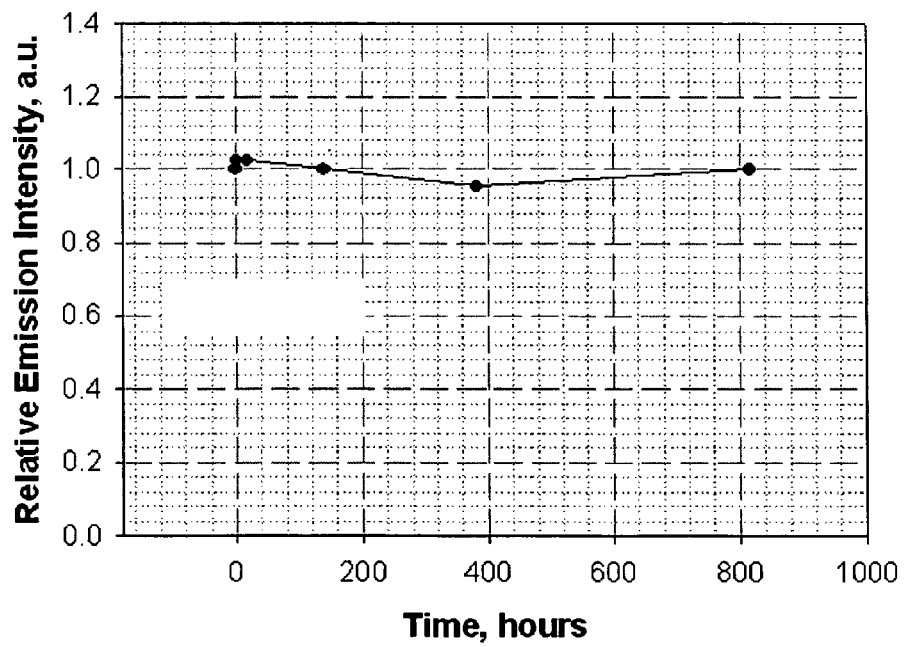

Preparation of $(CaSiO_3)_m.(SiO_2)_n$:$Eu^{2+}$, I 1.14 g of $Eu_2O_3$, (0.65 mole %), 3.9 g of CaO (7 mole %), 0.78 g of $CaF_2$ (1 mole %), 60.08 g of silicic acid (100 mole %) and 14 g of $NH_4I$ (9.6 mole %) were mixed in dry powder form. The mixed powder was further dried in nitrogen at 140° C. for 4 hours. The powder was then fired at 900° C. in dry nitrogen for 1 hour. After the material cooled down, 14 g of $NH_4I$ was added and mixed again. The mixed powder was fired at 1000° C. in forming gas for 1 hour. The phosphor obtained was $(CaSiO_3)_m.(SiO_2)_n$:$Eu^{2+}$, $I^-$, and emitted bright blue light peaking at 465 n upon 410 nm light excitation, as shown in FIG. 5. The phosphor showed polymorphous crystalline composition with Wollastonite of $CaSiO_3$ and cristobalite $SiO_2$. Longevity at 85° C. and 85% relative humidity is shown in FIG. 6.

EXAMPLE 3b-i

Preparation of $(CaSiO_3)_m.(SiO_2)_n$:$Eu^{2+}$, I

The method of Example 3a was used, except that the concentration of $Eu^{2+}$ was varied to obtain the following phosphors:

| | Phosphor Formula | $[Eu^{2+}]$, mol % | Emitting Peak, nm |
|---|---|---|---|
| b | $(CaSiO_3).(SiO_2)_n$:$Eu^{2+}$, $I^-$ | 0.25 | 466 |
| c | $(CaSiO_3)_m.(SiO_2)_n$:$Eu^{2+}$, $I^-$ | 0.45 | 465 |
| d | $(CaSiO_3)_m.(SiO_2)_n$:$Eu^{2+}$, $I^-$ | 0.65 | 465 |
| e | $(CaSiO_3)_m.(SiO_2)_n$:$Eu^{2+}$, $I^-$ | 0.85 | 466 |
| f | $(CaSiO_3)_m.(SiO_2)_n$:$Eu^{2+}$, $I^-$ | 1.2 | 466 |
| g | $(CaSiO_3)_m.(SiO_2)_n$:$Eu^{2+}$, I | 1.5 | 466 |
| h | $(CaSiO_3)_m.(SiO_2)_n$:$Eu^{2+}$, I | 2.0 | 465 |
| i | $(CaSiO_3)_m.(SiO_2)_n$:$Eu^{2+}$, I | 3.0 | 465 |

EXAMPLE 4

Figure 7:
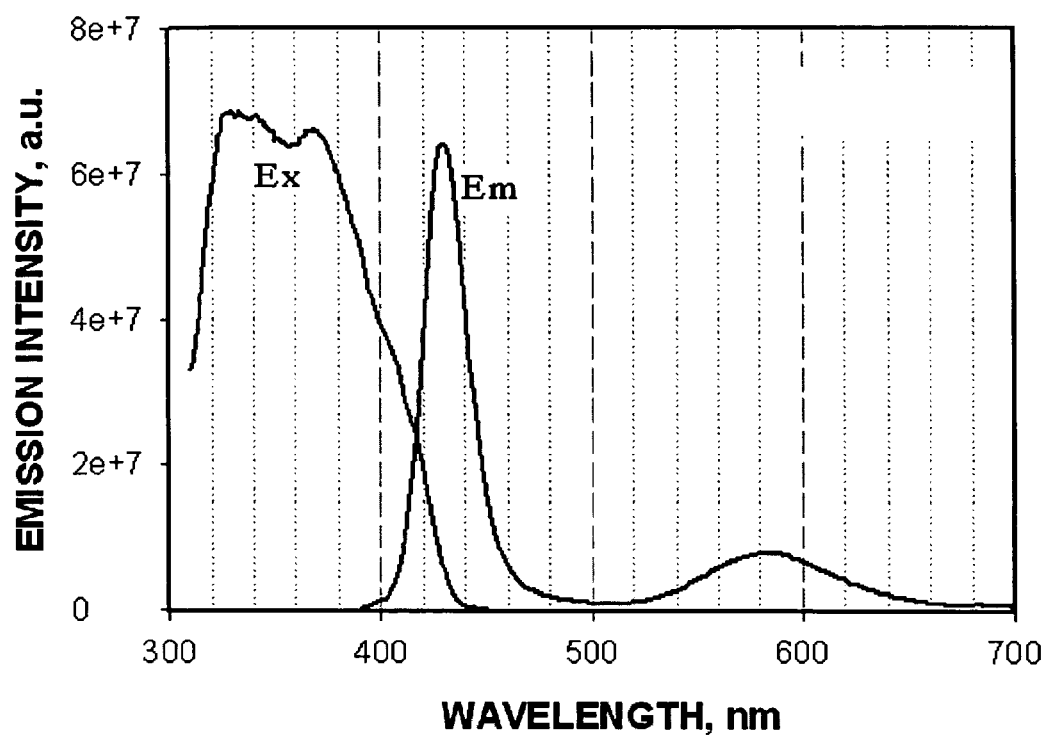

Preparation of $(CaSiO_3)_m.(SiO_2)_n$:$Eu^{2+}$, $Mn^{2+}$, Br 1.14 g of $Eu_2O_3$, (0.65 mole %), 3.9 g of CaO (9.7 mole %), 0.78 g of $CaF_2$ (1 mole %), 0.115 g of $MnCO_3$ (0.1 mole %), 60.08 g of silicic acid (100 mole %) and 16 g of $NH_4Br$ (16 mole %) were mixed by dry grinding. The mixed powder was further dried in dry nitrogen at 140° C. for 4 hours. The powder was then fired at 900° C. in forming gas for 1 hour. After the material cooled down, 14 g of NH$_4$Br was added and mixed again. The mixed powder was fired at 1000° C. in forming gas for 1 hour. The phosphor obtained was (CaSiO$_3$)$_m$.(SiO$_2$)$_n$:Eu$^{2+}$, Mn$^{2+}$, Br$^-$, and emitted bright blue light (430 m) and orange light (584 nm) upon 400 nm light excitation, as shown in FIG. 7.

EXAMPLE 5

Figure 8:
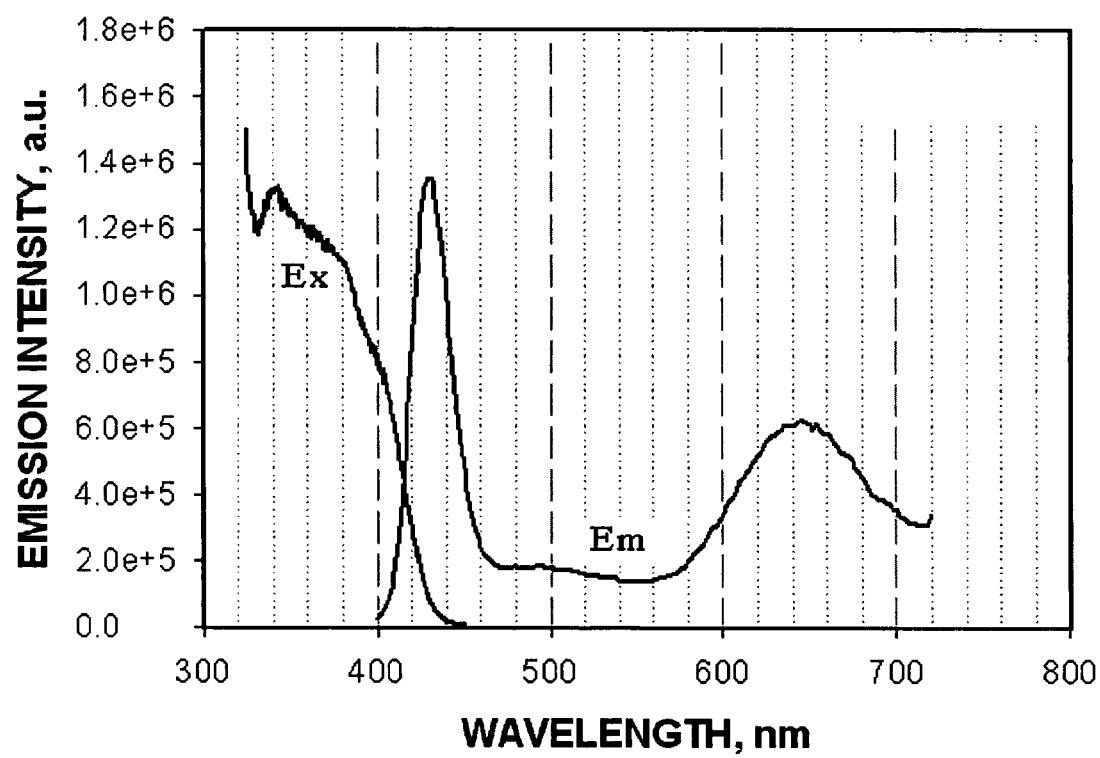
Figure 9:
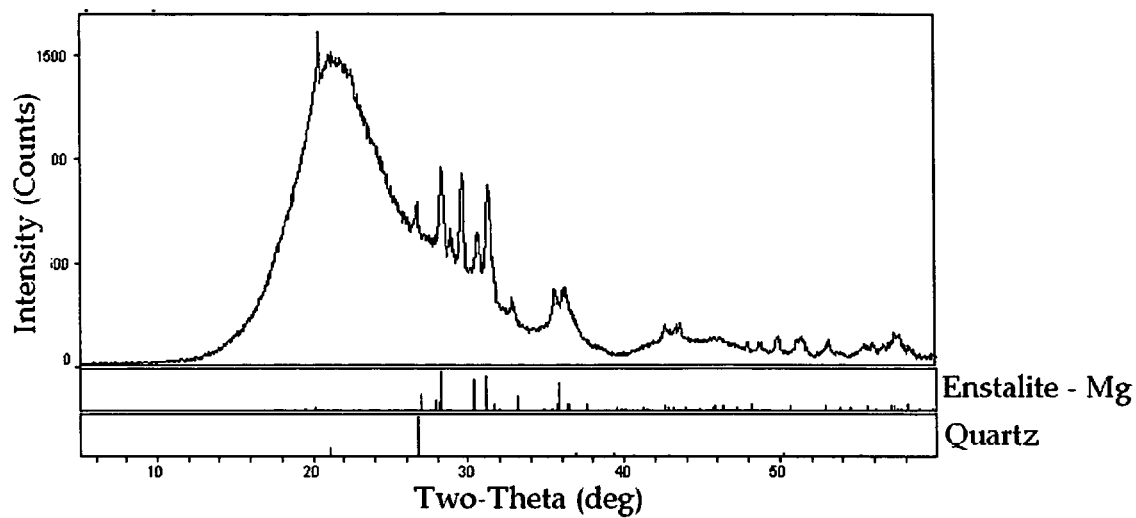

Preparation of (MgSiO$_3$)$_m$.(SiO$_2$)$_n$:Eu$^{2+}$, Mn$^{2+}$, I$^-$ 1.14 g of Eu$_2$O$_3$, (0.65 mole %), 3.9 g of MgO (7 mole %), 0.115 g of MnCO$_3$ (0.1 mole %), 60.08 g of silicic acid (100 mole %) and 14 g of NH$_4$I (15 mole %) were mixed in dry powder form. The mixed powder was further dried in dry nitrogen at 140° C. for 4 hours. The powder was then fired at 900° C. in forming gas for 1 hour. After the material cooled down, 14 g of NH$_4$I was added and mixed again. The mixed powder was fired at 1000° C. in forming gas for 1 hour. The phosphor obtained was (MgSiO$_3$)$_m$.(SiO$_2$)$_n$:Eu$^{2+}$, Mn$^{2+}$, I$^-$. The silica, SiO$_2$, comprises crystallized in cristobalite form and the magnesium inosilicate is in the enstalite form, as evidenced by X-ray diffraction pattern shown in FIG. 9 (shown relative to enstalite MgSiO$_3$ and to quartz). This diffraction pattern shows the silica is largely amorphous. This phosphor emitted at 430 nm (e.g., blue) and at 644 nm (e.g., red) upon 410 nm light excitation as shown in FIG. 8.

EXAMPLE 6

Figure 10:
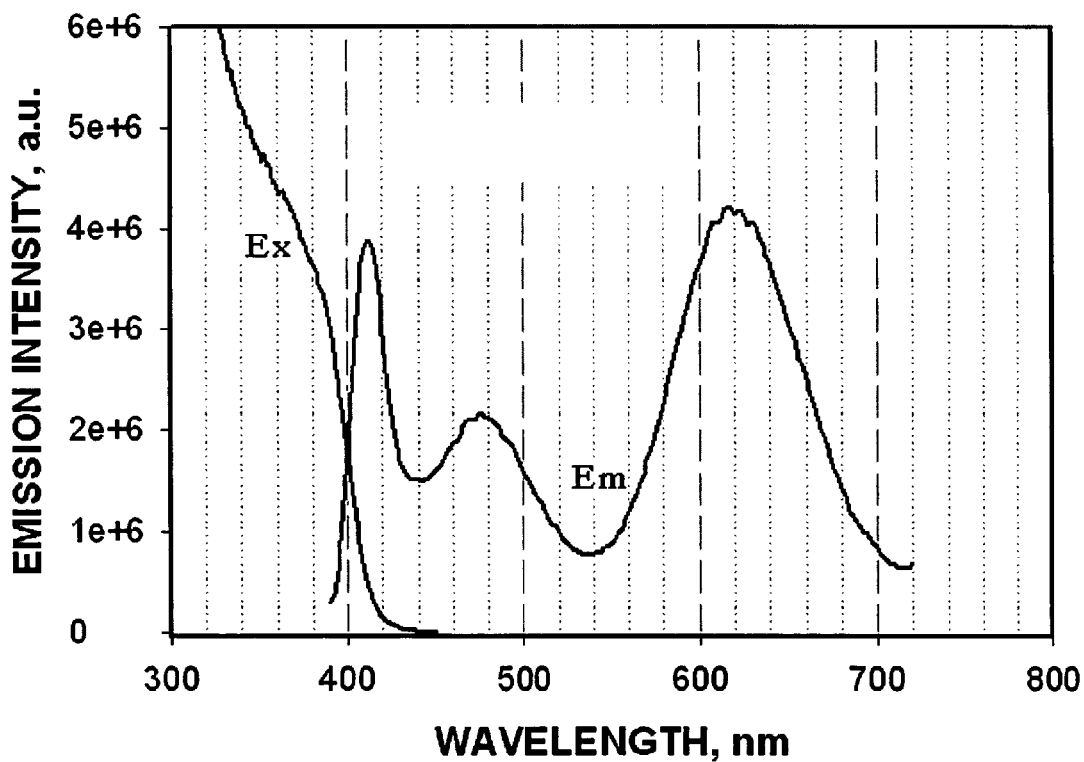

Preparation of (MgSiO$_3$)$_m$.(SiO$_2$)$_n$:Eu$^{2+}$, Mn$^{2+}$, Br$^-$ 1.14 g of Eu$_2$O$_3$, (0.65 mole %), 3.9 g of MgO (7 mole %), 0.115 g of MnCO$_3$ (0.1 mole %), 60.08 g of silicic acid (100 mole %) and 16 g of NH$_4$Br (16.3 mole %) was mixed by dry grinding. The mixed powder was further dried in dry nitrogen at 140° C. for 4 hours. The powder was then fired at 900° C. in forming gas for 1 hour. After the material cooled down, 14 g of NH$_4$Br was added and mixed again. The mixed powder was fired at 1000° C. in forming gas for 1 hour. The phosphor obtained was (MgSiO$_3$)$_m$.(SiO$_2$)$_n$: Eu$^{2+}$, Mn$^{2+}$ Br$^-$, and emitted at 410 nm (e.g., blue), at 475 nm (e.g., blue) and at 620 nm (e.g., red) upon 400 nm light excitation as shown in FIG. 10.

EXAMPLE 7

Figure 11:
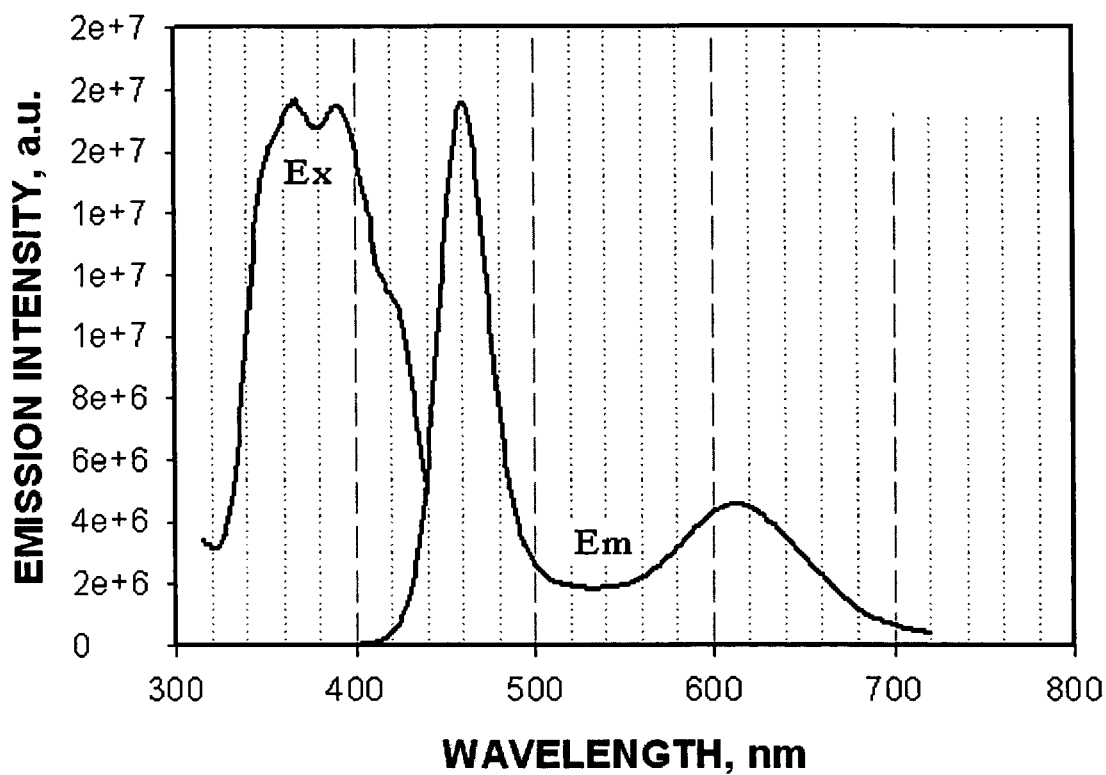

Preparation of CaSiO$_3$:Eu$^{2+}$, Mn$^{2+}$, I$^-$ 1.14 g of Eu$_2$O$_3$, (0.65 mole %), 3.9 g of CaO (7 mole %), 0.78 g of CaF$_2$ (1 mole %), 0.115 g of MnCO$_3$ (0.1 mole %), 60.08 g of silicic acid (100 mole %) and 16 g of NH$_4$I (11 mole %) was mixed by dry grinding. The mixed powder was further dried in dry nitrogen at 140° C. for 4 hours. The powder was then fired at 900° C. in forming gas for 1 hour. After the material cooled down, 14 g of NH$_4$I was added and mixed again. The mixed powder was fired at 1000° C. in forming gas for 1 hour. The phosphor obtained was CaSiO$_3$: Eu$^{2+}$, Mn$^{2+}$, I$^-$, and emitted upon 400 nm light excitation, as shown in FIG. 11 (blue at 460 nm and red at 610 nm).

EXAMPLE 8

Figure 12:
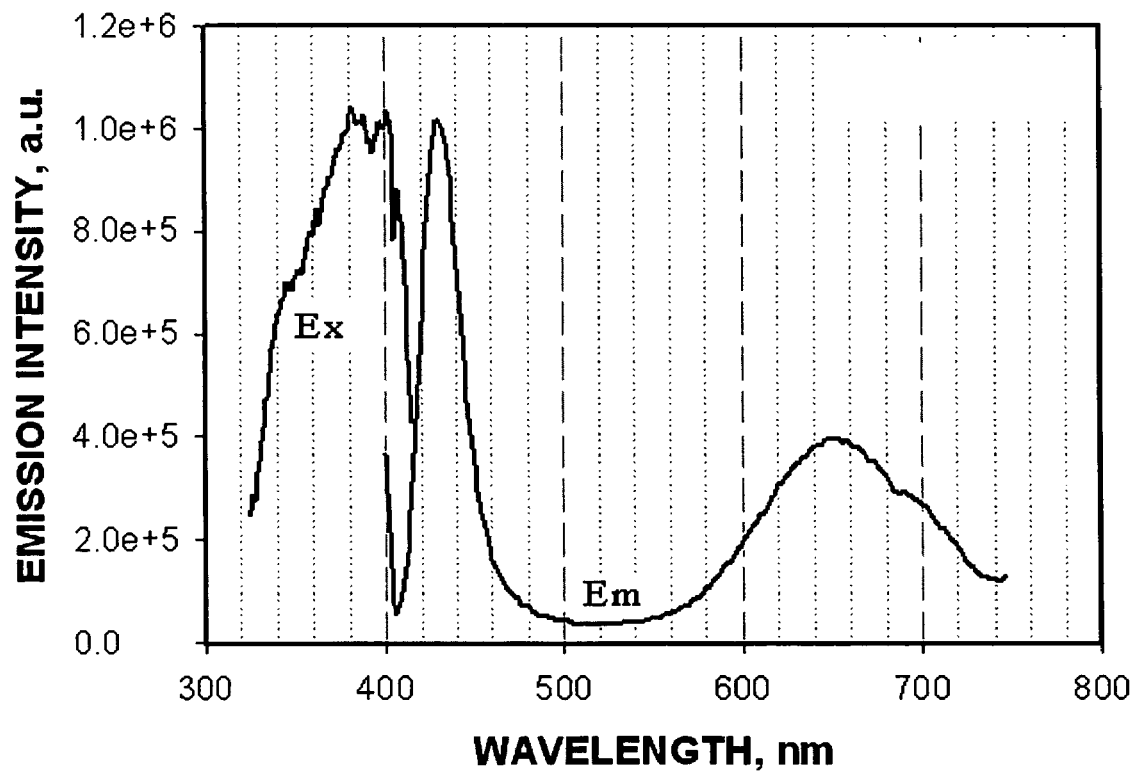

Preparation of (SiO$_2$)$_n$:Eu$^{2+}$, Mn$^{2+}$, I$^-$ 1.14 g of Eu$_2$O$_3$, (0.65 mole %), 0.78 g of CaF$_2$ (1 mole %), 0.115 g of MnCO$_3$ (0.1 mole %), 60.08 g of silicic acid (100 mole %) and 16 g of NH$_4$I (11 mole %) was mixed by dry grinding. The mixed powder was further dried in dry nitrogen at 140° C. for 4 hours. The powder was then fired at 900° C. in forming gas for 1 hour. After the material cooled down, 14 g of NH$_4$Br was added and mixed again. The mixed powder was fired at 1000° C. in forming gas for 1 hour. The phosphor obtained was (SiO$_2$)$_n$:Eu$^{2+}$, Mn$^{2+}$, I$^-$, and emitted upon 400 nm light excitation as shown in FIG. 12 (blue at 430 nm and red at 640 nm).

EXAMPLE 9

Making a White Light Device with 410 nm-Emitting LED Chip and a First Phosphor Blend The phosphor blend is made of a red emitting metal silicate-silica-based, polymorphous phosphor (CaSiO$_3$)$_m$.(SiO$_2$)$_n$:Eu$^{2+}$, Mn$^{2+}$, I$^-$ as made in Example 1, a green-emitting phosphor, BaMgAl$_{10}$O$_{17}$:Eu$^{2+}$,Mn$^{2+}$ (BAM:Eu, Mn) (G) and a blue-emitting phosphor (CaSiO$_3$)$_m$.(SiO$_2$)$_n$: Eu$^{2+}$, I$^-$ (B) as made in Example 3. Mix the three phosphors with appropriate weight ratios and further mix the phosphor blend with epoxy resin to form a slurry. Apply the slurry onto an InGaN-based LED chip that emits at 410 nm. The device generates light with white color whose color coordinates can be varied by changing the ratio of the three phosphors.

EXAMPLE 10

Making a White Light Device with 410 nm-Emitting LED Chip and a Second Phosphor Blend The phosphor blend is made of a red emitting metal silicate-silica-based, polymorphous phosphor (CaSiO$_3$)$_m$.(SiO$_2$)$_n$:Eu$^{2+}$, Mn$^{2+}$, I$^-$ as made in Example 1, a green-emitting phosphor, SrGa$_2$S$_4$:Eu$^{2+}$ (STG:Eu) (G) and a blue-emitting phosphor (CaSiO$_3$)$_m$.(SiO$_2$)$_n$:Eu$^{2+}$, I$^-$ (B) as made in Example 3. Mix the three phosphorswith appropriate weight ratios and further mix the phosphor blend with epoxy resin to form a slurry. Apply the slurry onto an InGaN-based LED chip that emits at 410 nm. The device generates light with white color whose color coordinates can be varied by changing the ratio of the three phosphors. The device architecture can be as in FIG. 13

EXAMPLE 11

Making a Purple Light Device with 410 nm-Emitting LED Chip and a Purple-Emitting Phosphor A single phosphor, the purple-emitting (CaSiO$_3$)$_m$.(SiO$_2$)$_n$:Eu$^{2+}$, Mn$^{2+}$, Cl$^-$ as made in Example 2 is mixed with epoxy resin to form a slurry. The slurry is applied onto an InGaN-based LED chip that emits at 410 nm. The device generates light with purple color. This light color is suitable for certain lighting in entertainment environment.

Publications and references, including but not limited to patents and patent applications, cited in this specification are herein incorporated by reference in their entirety in the entire portion cited as if each individual publication or reference were specifically and individually indicated to be incorporated by reference herein as being fully set forth. Any patent application to which this application claims priority is also incorporated by reference herein in the manner described above for publications and references.

While this invention has been described with an emphasis upon preferred embodiments, it will be obvious to those of ordinary skill in the art that variations in the preferred devices and methods may be used and that it is intended that the invention may be practiced otherwise than as specifically described herein. Accordingly, this invention includes all modifications encompassed within the spirit and scope of the invention as defined by the claims that follow.

What is claimed is:

1. A light emitting device comprising:
a semiconductor light source that produces a light output of a wavelength of at least about 300 nm; and
a wavelength manager, which is located between the semiconductor light source and a light output produced by the light emitting device, comprising a phosphor according to formula (I):

$$[(BvSiO_3)_x(Mv_2SiO_3)_y(Tv_2(SiO_3)_3)_z]_m \cdot (SiO_2)_n : R\epsilon, X \quad (I)$$

wherein:
x, y and z are each any value such that x+y+z=1;
Bv is at least one divalent metal ion;
Mv is at least one monovalent alkali metal ion;
Tv is at least one trivalent metal ion;
Rε is at least one activator selected from $Eu^{2+}$ and $Mn^{2+}$ ions;
X is at least one halide ion;
m is 1 or 0, provided that:
if m is 1 and provides an amount of silica effective to host useful luminescence, then n>3; or
if m is 0, then n is 1.

2. The light emitting device of claim 1, wherein the wavelength manager further comprises at least one additional phosphor that adjusts the light output produced by the light emitting device.

3. The light emitting device of claim 2, wherein the wavelength manager changes the light output of the semiconductor light source such that the light output of the light emitting device is white light.

4. The light emitting device of claim 1, wherein the semiconductor light source comprises a quantum well structure having a light emitting layer sandwiched between a p-type clad layer and an n-type clad layer.

5. The light emitting device of claim 4, wherein:
the p-type clad layer is formed of $Al_qGa_{1-q}N$, wherein 0<q<1;
the n-type clad layer is formed of $Al_rGa_{1-r}N$, wherein 0≦r<1; and
optionally, the p-type clad layer has a band gap larger than a band gap of the n-type clad layer.

6. The light emitting device of claim 1, wherein the semiconductor light source comprises a light emitting layer containing indium and at least two quantum well structures.

7. The light emitting device of claim 6, wherein:
optionally, at least two quantum well structures comprise at least one well layer of InGaN and at least one barrier layer of GaN;
optionally, at least two quantum well structures comprise at least one well layer of InGaN and at least one barrier layer of AlGaN; and
optionally, at least two quantum well structures comprise at least one well layer of AlInGaN and at least one barrier layer of AlInGaN,
wherein:
at least one barrier layer has a band gap larger than a band gap of at least one well layer; and
optionally, at least one well layer has a thickness of at most about 100 angstroms.

8. The light emitting device of claim 1, wherein the semiconductor light source comprises at least two quantum well structures.

9. The light emitting device according to claim 1, wherein the semiconductor light source comprises at least one light emitting diode (LED) on a substrate.

10. The light emitting device of claim 1, wherein at least one monovalent alkali metal ion of Mv is selected from the group consisting of Li, Na and K.

11. The light emitting device of claim 1, wherein at least one divalent metal ion of Bv is selected from the group consisting of Be, Mg, Ca, Sr, Ba, Mn, Co, Ni, Cu, Zn, Cd and Hg.

12. The light emitting device of claim 11, wherein at least one divalent metal ion of Bv is selected from the group consisting of Ca and Sr.

13. The light emitting device of claim 1, wherein at least one trivalent metal ion of Tv is selected from the group consisting of Al, Ga, In, Sc, Y and La.

14. The light emitting device of claim 1, wherein Rε comprises $Eu^{2+}$ ions.

15. The light emitting device of claim 1, wherein Rε comprises $Mn^{2+}$ ions.

16. The light emitting device of claim 1, wherein Rε comprises $Eu^{2+}$ and $Mn^{2+}$ ions.

17. The light emitting device of claim 1, wherein the phosphor has a formula of:

$$(CaSiO_3)_m \cdot (SiO_2)_n : Eu^{2+}, Mn^{2+}, I^-,$$

wherein m and n are as previously defined and the $Eu^{2+}$ and $Mn^{2+}$ ions have a concentration and ratio between $Eu^{2+}$ and $Mn^{2+}$ that provide a peak emission between about 620 nm and about 660 nm and a chromaticity of x=0.62±0.06, y=0.30±0.06.

18. The light emitting device of claim 1, wherein the phosphor has a formula of:

$$(CaSiO_3)_m \cdot (SiO_2)_n : Eu^{2+}, I^-,$$

wherein m and n are as previously defined and the $Eu^{2+}$ ion has a concentration that provides a peak emission between about 445 nm and about 480 nm and a chromaticity of x=0.20±0.06, y=0.10±0.06.

19. The light emitting device of claim 1, wherein the phosphor has a formula of:

$$(CaSiO_3)_m \cdot (SiO_2)_n : Eu^{2+}, Mn^{2+}, Cl^-,$$

wherein m and n are as previously defined and the $Eu^{2+}$ and $Mn^{2+}$ ions have a concentration and ratio that provide a chromaticity of x=0.40±0.06, y=0.20±0.06.

20. The light emitting device of claim 1, wherein the silica comprises a cristobalite form.

21. The light emitting device of claim 20, wherein Bv, Mv, Tv or a combination thereof comprises metal silicate in calcite form.

22. The light emitting device of claim 20, wherein Bv, Mv, Tv or a combination thereof comprises metal silicate in Wollastonite form.

23. The light emitting device of claim 20, wherein Bv, Mv, Tv or a combination thereof comprises metal silicate in enstalite form.

24. A phosphor according to formula (I):

$$[(BvSiO_3)_x(Mv_2SiO_3)_y(Tv_2(SiO_3)_3)_z]_m \cdot (SiO_2)_n : R\epsilon, X \quad (I)$$

wherein:
x, y and z are each any value such that x+y+z=1;
Bv is at least one divalent metal ion;
Mv is at least one monovalent alkali metal ion;
Tv is at least one trivalent metal ion;
$R\epsilon$ is at least one activator selected from $Eu^{2+}$ and $Mn^{2+}$ ions;
X is at least one halide ion;
m is 1 or 0, provided that:
    if m is 1 and provides an amount of silica effective to host useful luminescence, then n>3; or
    if m is 0, then n is 1.

25. The phosphor of claim 24, wherein at least one monovalent alkali metal ion of Mv is selected from Li, Na and K.

26. The phosphor of claim 25, wherein at least one divalent metal ion of Bv is selected from Ca and Sr.

27. The phosphor of claim 24, wherein at least one divalent metal ion of Bv is selected from the group consisting of Be, Mg, Ca, Sr, Ba, Mn, Co, Ni, Cu, Zn, Cd and Hg.

28. The phosphor of claim 24, wherein at least one trivalent metal ion of Tv is selected from the group consisting of Al, Ga, In, Sc, Y and La.

29. The phosphor of claim 24, wherein $R\epsilon$ comprises $Eu^{2+}$ ions.

30. The phosphor of claim 24, wherein $R\epsilon$ comprises $Mn^{2+}$ ions.

31. The phosphor of claim 24, wherein $R\epsilon$ comprises $Eu^{2+}$ and $Mn^{2+}$ ions.

32. The phosphor of claim 24, wherein the phosphor has a formula of:

$$(CaSiO_3)_m \cdot (SiO_2)_n : Eu^{2+}, Mn^{2+}, I^-,$$

wherein m and n are as previously defined and the $Eu^{2+}$ and $Mn^{2+}$ ions have a concentration and ratio between $Eu^{2+}$ and $Mn^{2+}$ that provide a peak emission between about 620 nm and about 660 nm and a chromaticity of x=0.62±0.06, y=0.30±0.06.

33. The phosphor of claim 24, wherein the phosphor has a formula of:

$$(CaSiO_3)_m \cdot (SiO_2)_n : Eu^{2+}, I^-,$$

wherein m and n are as previously defined and the $Eu^{2+}$ ion has a concentration that provides a peak emission between about 445 nm and about 480 nm and a chromaticity of x=0.20±0.06, y=0.10±0.06.

34. The phosphor of claim 24, wherein the phosphor has a formula of:

$$(CaSiO_3)_m \cdot (SiO_2)_n : Eu^{2+}, Mn^{2+}, Cl^-,$$

wherein m and n are as previously defined and the $Eu^{2+}$ and $Mn^{2+}$ ions have a concentration and ratio between $Eu^{2+}$ and $Mn^{2+}$ provide a chromaticity of x=0.40±0.06, y=0.20±0.06.

35. The phosphor of claim 24, wherein Bv, Mv, Tv or a combination thereof comprises metal silicate in Wollastonite form and the silica comprises a cristobalite form.

36. The phosphor of claim 24, wherein Bv, Mv, Tv or a combination thereof comprises metal silicate in calcite form and the silica comprises a cristobalite form.

37. The phosphor of claim 24, wherein Bv, Mv, Tv or a combination thereof comprises metal silicate in enstalite form and the silica comprises a cristobalite form.

38. The phosphor of claim 24, wherein X has a mole percentage of about 0.002% to about 5% of $SiO_2$.

39. A method of producing a phosphor according to formula (I):

$$[(BvSiO_3)_x(Mv_2SiO_3)_y(Tv_2(SiO_3)_3)_z]_m \cdot (SiO_2)_n : R\epsilon, X \quad (I)$$

wherein:
x, y and z are each any value such that x+y+z=1;
Bv is at least one divalent metal ion;
Mv is at least one monovalent alkali metal ion;
Tv is at least one trivalent metal ion;
$R\epsilon$ is at least one activator selected from $Eu^{2+}$ and $Mn^{2+}$ ions;
X is at least one halide ion;
m is 1 or 0, provided that:
    if m is 1 and provides an amount of silica effective to host useful luminescence, then n>3; or
    if m is 0, then n is 1,
the method comprising the steps of:
    providing an appropriate mixture of precursors; and
    firing the appropriate mixture at a temperature from about 900° C. to about 1300° C. under a reducing atmosphere and in presence of a halide source to produce the phosphor,
wherein X of the phosphor has a mole percentage of about 0.002% to about 5% $SiO_2$.

40. The method of claim 39, further comprising the step, prior to the firing step, of heating the appropriate mixtureat a temperature from about 700° C. to about 1100° C. under a reducing atmosphere, wherein the heating is at a temperature lower than the temperature of the firing step.

41. The method of claim 40, wherein a halide source is present in during the heating step.

* * * * *